United States Patent
Ito et al.

(10) Patent No.: US 9,570,337 B2
(45) Date of Patent: Feb. 14, 2017

(54) FILM FORMATION APPARATUS AND FILM FORMATION METHOD

(71) Applicants: NUFLARE TECHNOLOGY, INC, Yokohama-shi, Kanagawa-ken (JP); DENSO CORPORATION, Kariya-shi, Aichi-ken (JP)

(72) Inventors: Hideki Ito, Yokohama (JP); Hidekazu Tsuchida, Yokosuka (JP); Isaho Kamata, Tokyo (JP); Masahiko Ito, Yokosuka (JP); Masami Naito, Inazawa (JP); Hiroaki Fujibayashi, Chiryu (JP); Ayumu Adachi, Toyota (JP); Koichi Nishikawa, Nagoya (JP)

(73) Assignees: NuFlare Technology, Inc., Yokohama-shi (JP); Denso Corporation, Kariya-shi (JP)

( * ) Notice: Subject to any disclaimer, the term of this patent is extended or adjusted under 35 U.S.C. 154(b) by 52 days.

(21) Appl. No.: 14/219,159

(22) Filed: Mar. 19, 2014

(65) Prior Publication Data
US 2014/0287539 A1    Sep. 25, 2014

(30) Foreign Application Priority Data
Mar. 25, 2013   (JP) .................................. 2013-062150

(51) Int. Cl.
| | | |
|---|---|---|
| *H01L 21/67* | (2006.01) | |
| *H01L 21/687* | (2006.01) | |
| *C23C 16/44* | (2006.01) | |
| *C30B 25/10* | (2006.01) | |
| *C30B 25/14* | (2006.01) | |
| *C30B 25/16* | (2006.01) | |

(52) U.S. Cl.
CPC ..... *H01L 21/68785* (2013.01); *C23C 16/4408* (2013.01); *C30B 25/10* (2013.01);
(Continued)

(58) Field of Classification Search
CPC ............. C23C 16/45519; C23C 16/455; H01L 21/6719; H01L 21/67207; H01L 21/00
See application file for complete search history.

(56) References Cited

U.S. PATENT DOCUMENTS

| | | | | |
|---|---|---|---|---|
| 5,884,009 A | * | 3/1999 | Okase | ............... H01L 21/67115 |
| | | | | 219/405 |
| 2007/0087579 A1 | * | 4/2007 | Kitayama | ........... C23C 16/4405 |
| | | | | 438/778 |

(Continued)

FOREIGN PATENT DOCUMENTS

| | | |
|---|---|---|
| JP | 8-148639 | 6/1996 |
| JP | 2008-124474 | 5/2000 |

(Continued)

OTHER PUBLICATIONS

Notification of Reasons for Rejection issued by the Korean Intellectual Property Office on Jun. 24, 2015, for Korean Patent Application No. 10-2014-0033960, and English-language translation thereof.

(Continued)

*Primary Examiner* — Bac Au
(74) *Attorney, Agent, or Firm* — Finnegan, Henderson, Farabow, Garrett & Dunner LLP

(57) ABSTRACT

At the time of transporting a substrate into or from a space where a film formation process is performed, the space where the film formation process is performed, a space where a lower heater 16 is provided, and a space where an upper heater 19 is provided are made in an inert gas atmosphere.

7 Claims, 2 Drawing Sheets

Figure 1:
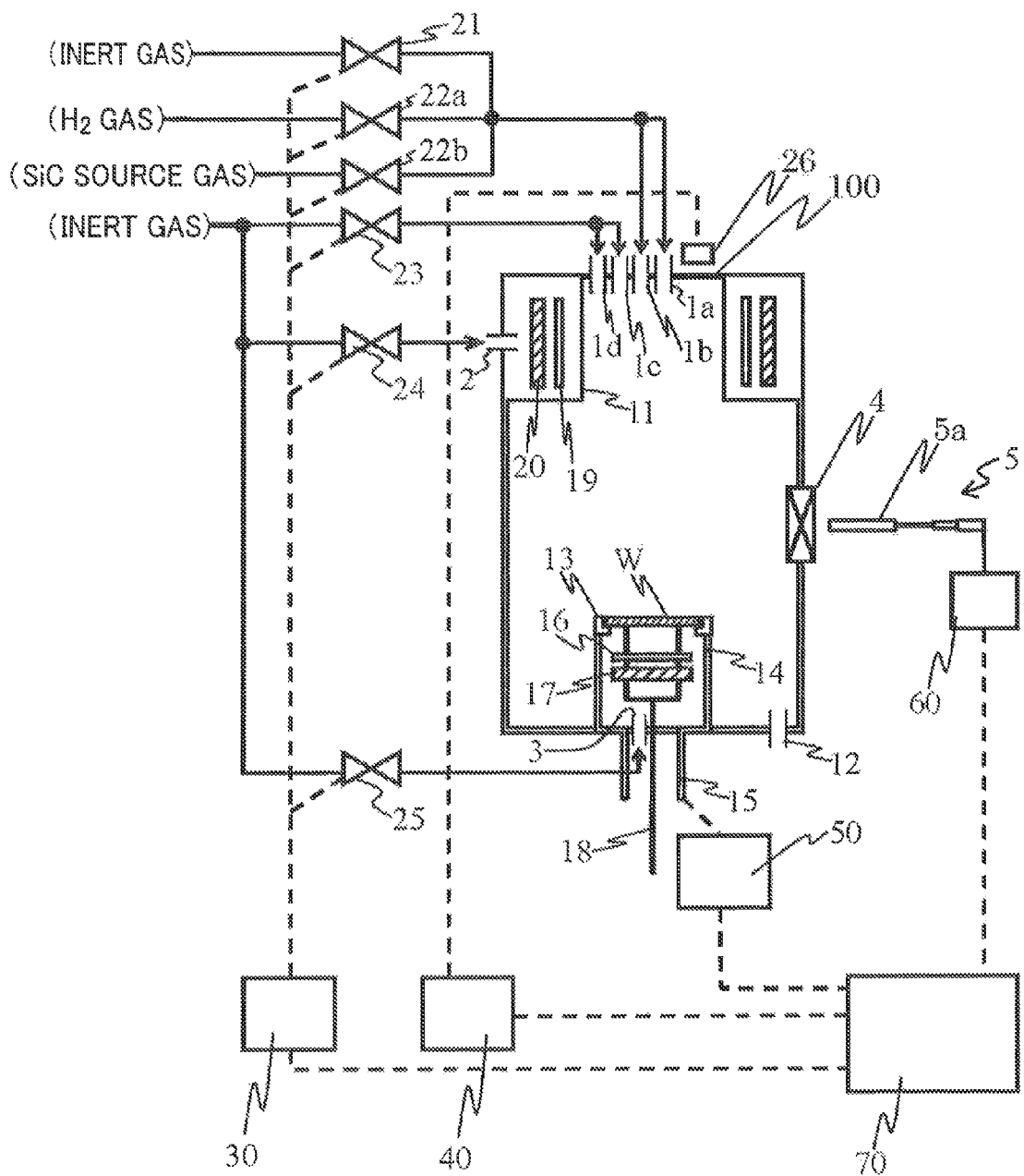

(52) U.S. Cl.
CPC .............. *C30B 25/14* (2013.01); *C30B 25/16* (2013.01); *H01L 21/67109* (2013.01)

(56) References Cited

U.S. PATENT DOCUMENTS

| | | | |
|---|---|---|---|
| 2008/0219824 A1* | 9/2008 | Newman | H01L 21/67115 414/744.5 |
| 2009/0314209 A1* | 12/2009 | Son | C23C 16/4581 118/724 |
| 2011/0206866 A1* | 8/2011 | Suzuki | C23C 16/4557 427/587 |
| 2011/0210118 A1* | 9/2011 | Hirochi | H05B 6/108 219/647 |
| 2012/0048180 A1 | 3/2012 | Ito et al. | |
| 2012/0244684 A1* | 9/2012 | Suzuki | C23C 16/45517 438/478 |
| 2012/0325138 A1 | 12/2012 | Suzuki et al. | |
| 2013/0247816 A1* | 9/2013 | Suzuki | H01L 21/02529 117/86 |
| 2013/0255784 A1* | 10/2013 | Ye | H01L 21/02 137/1 |

FOREIGN PATENT DOCUMENTS

| | | |
|---|---|---|
| JP | 2001-291671 A | 10/2001 |
| JP | 2010-171347 A | 8/2010 |
| JP | 2012-069904 A | 4/2012 |
| JP | 2013-038225 A | 2/2013 |
| KR | 10-2012-0034547 | 4/2012 |
| KR | 10-2012-0140631 | 12/2012 |

OTHER PUBLICATIONS

Notification of Reasons for Rejection issued by the Korean Intellectual Property Office on Dec. 18, 2014, for Korean Patent Application No. 10-2014-0033960, and English-language translation thereof.

Office Action issued by the Taiwanese Patent Office on Jan. 21, 2016, in counterpart Taiwanese Patent Application No. 103109917.

Notification of Reason for Rejection issued by the Japanese Patent Office on Apr. 22, 2016, in counterpart Japanese Patent Application No. 2013-062150.

* cited by examiner

FILM FORMATION APPARATUS AND FILM FORMATION METHOD

CROSS REFERENCE TO RELATED APPLICATIONS

This application is based upon and claims the benefit of priority from the prior Japanese Patent Application No. 2013-062150, filed on Mar. 25, 2013, the entire contents of which are incorporated herein by reference.

FIELD

The embodiments of the present invention relate to a film formation apparatus and film formation method.

BACKGROUND

There is known SiC (silicon carbide) as a material that is recently expected for use in a high breakdown-voltage power semiconductor device. When SiC is epitaxially grown to obtain an SiC single-crystal thin film, it is necessary to heat a substrate at a high temperature equal to or higher than 1500° C. ("film formation temperature"). To heat the substrate, a lower heater heating the substrate from below and an upper heater heating the substrate from above are provided.

To protect these heaters from corrosive gas such as reactive gas, the corrosive gas is purged from the surroundings of these heaters to make the heaters in an atmosphere of, for example, inert gas such as argon gas. It is particularly necessary to make a space where the lower heater is provided into a perfect atmosphere of inert gas during a film formation process because the lower heater made of carbon is corroded by the corrosive gas such as the reactive gas at a temperature of about 1000° C.

However, the conventional technique has the following problems. During the film formation process, the space where the lower heater is provided is isolated from a space where the film formation process is performed by the substrate mounted on a susceptor, and the corrosive gas is purged from the space of the lower heater and the lower heater is made into the inert gas atmosphere. However, at the time of transporting the substrate into or from the space where the film formation process is performed before or after the film formation process, the space is continuous to the space where the lower heater is provided and the corrosive gas such as the reactive gas enters the space of the lower heater because the substrate is not mounted on the susceptor. Thereafter, when the substrate is heated up to the film formation temperature, the corrosive gas that enters the space corrodes the lower heater. Furthermore, it is necessary to set a temperature at the time of transporting the substrate into or from the space where the film formation process is performed ("transport temperature") to be equal to or lower than a temperature at which the corrosive gas corrodes the lower heater. It is disadvantageously impossible to improve productivity by increasing the transport temperature at the time of transporting the substrate into or from the space where the film formation process is performed before or after the film formation process.

The present invention has been achieved to solve the conventional problems. An object of the present invention is to provide a film formation apparatus and a film formation method capable of preventing corrosive gas from entering a space where a lower heater is provided and preventing the lower heater from being corroded by the corrosive gas at the time of transporting a substrate into or from a space where a film formation process is performed, and capable of improving productivity by enabling the substrate to be transported in a high temperature atmosphere.

SUMMARY

A film formation apparatus according to the present embodiment includes: a film formation chamber configured to perform a film formation process on a transported substrate; a hollow cylindrical liner configured to separate an inner wall of the film formation chamber from a space where the film formation process is performed; a susceptor configured to mount the substrate thereon; a rotary cylinder configured to support the susceptor on an upper portion of the rotary cylinder; a rotary shaft arranged below the film formation chamber, and configured to rotate the rotary cylinder; a first heater arranged in the rotary cylinder, and configured to heat the susceptor and the substrate from below; a second heater arranged between the liner and the inner wall, and configured to heat the susceptor and the substrate from above; a temperature control unit configured to control temperatures of the first and second heaters in order to set a temperature of the susceptor to be equal to a predetermined transport temperature or a predetermined film formation temperature; a temperature detection unit configured to detect the temperature of the susceptor; a first gas supply unit provided in an upper portion of the film formation chamber, and configured to supply at least either reactive gas or inert gas to inside of the liner, the reactive gas containing hydrogen gas and source gas; a second gas supply unit configured to supply the inert gas between the liner and the inner wall; a third gas supply unit configured to supply the inert gas into the rotary cylinder; a transport unit configured to transport the substrate into or from the film formation chamber at the predetermined transport temperature; and a gas supply control unit configured to execute a control to supply the inert gas from the first to third gas supply units at least when the transport unit transports the substrate into or from the film formation chamber, and to execute the control to supply the reactive gas from the first gas supply unit and to supply the inert gas from the second and third gas supply units when the substrate is mounted on the susceptor and the temperature of the susceptor is equal to the predetermined film formation temperature.

A film formation method according to the present embodiment executed in a film formation chamber where a predetermined film formation process on a substrate is performed, the method includes: causing a first gas supply unit to supply inert gas to inside of a hollow cylindrical liner, the hollow cylindrical liner separating an inner wall of the film formation chamber from a space where the film formation process is performed; causing a second gas supply unit to supply the inert gas between the hollow cylindrical liner and the inner wall; causing a third gas supply unit to supply the inert gas into a rotary cylinder, the rotary cylinder being arranged in the film formation chamber and supporting a susceptor mounting the substrate thereon on an upper portion of the rotary cylinder; controlling the susceptor to be heated in such a manner that a temperature of the susceptor is made equal to a predetermined transport temperature; transporting the substrate into the film formation chamber; increasing a temperature of the substrate to a predetermined film formation temperature while switching gas supplied from the first gas supply unit from the inert gas to hydrogen gas after mounting the substrate on the susceptor; performing the predetermined film formation process on the substrate by supplying reactive gas from the first gas supply unit while controlling the temperature of the substrate to be equal to the predetermined film formation temperature, the reactive gas containing the hydrogen gas and source gas; stopping supplying the source gas from the first gas supply unit after the predetermined film formation process; and transporting the substrate from the susceptor after controlling the temperature of the susceptor to be equal to the predetermined transport temperature while switching the gas supplied from the first gas supply unit from the hydrogen gas to the inert gas.

BRIEF OF THE DRAWINGS

Figure 2:
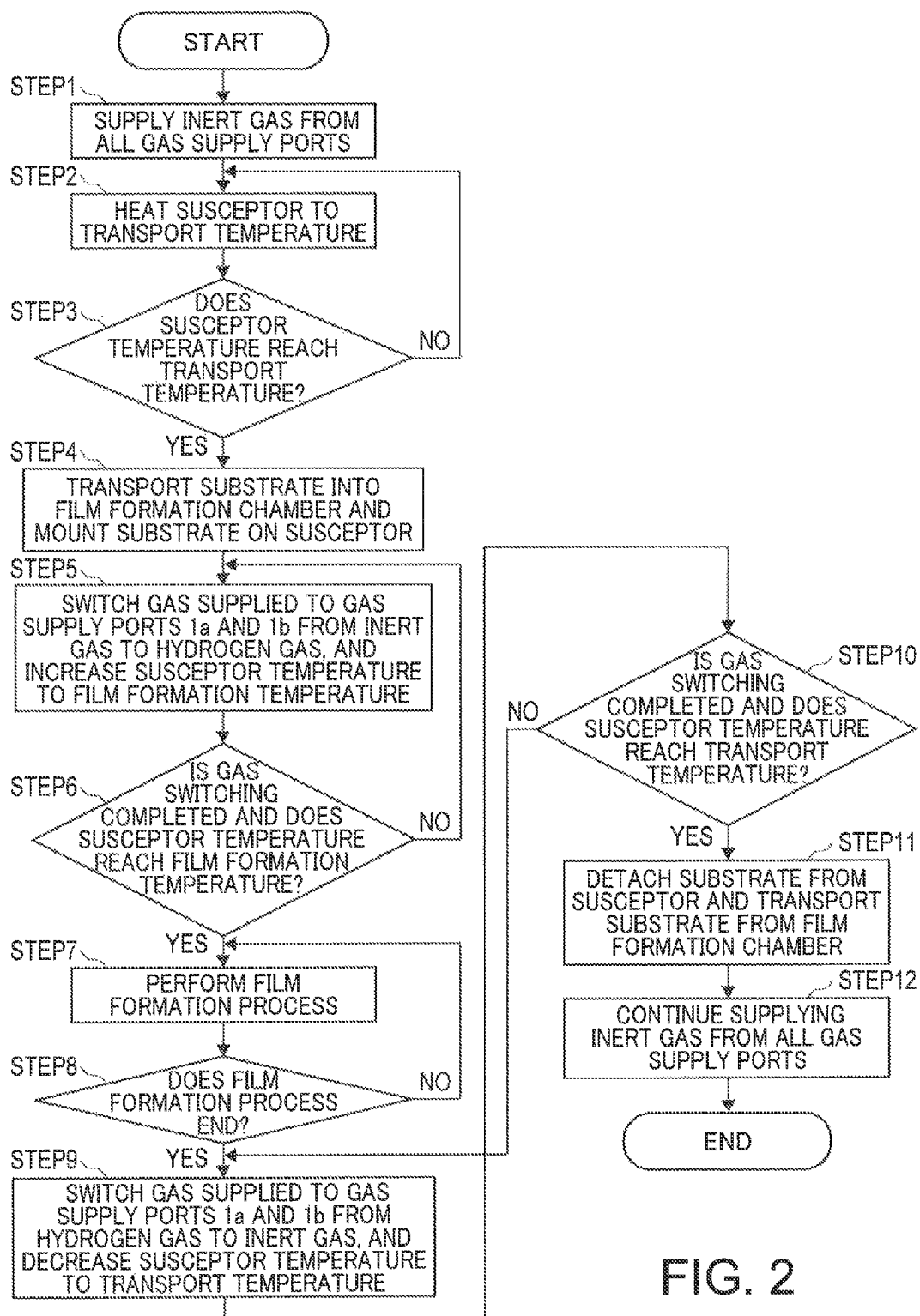

FIG. 1 is a cross-sectional view of a film formation apparatus according to an embodiment; and FIG. 2 is a flowchart showing an operation of the apparatus according to an embodiment.

DETAILED DESCRIPTION

Embodiments will now be explained with reference to the accompanying drawings. The present invention is not limited to the embodiments. Exemplary embodiments of the present invention will be explained below in detail with reference to the accompanying drawings.

FIG. 1 is a cross-sectional view of a film formation apparatus for epitaxially growing SiC according to an embodiment. As shown in FIG. 1, in a film formation chamber 100 where a substrate W is subjected to a film formation process, a hollow cylindrical liner 11 that separates an inner wall of the film formation chamber 100 from a space where the film formation process is performed is provided.

An annular susceptor 13 on which the substrate W to be subjected to the film formation process is mounted, and a rotary cylinder 14 that supports the susceptor 13 on an upper portion thereof are provided in the film formation chamber 100. A rotary shaft 15 rotating the rotary cylinder 14 is arranged below the film formation chamber 100. A rotary drive unit 50 driving this rotary shaft 15 is provided. For example, a member configured so that a surface of a base material such as SiC or C is covered with a high heat-resistance SiC layer or TaC layer can be used as the susceptor 13. A lower heater 16 made of carbon is provided in the rotary cylinder 14 for heating the susceptor 13 and the substrate W from below. A heat insulating material 17 is provided below the lower heater 16. A thrusting mechanism 18 actuated at the time of mounting the substrate W on the susceptor 13 or detaching the substrate W from the susceptor 13 is provided in the rotary cylinder 14.

An upper heater 19 for heating the susceptor 13 and the substrate W from above is provided in a space formed by the inner wall of the film formation chamber 100 and the liner 11. A heat insulating material 20 is provided between the upper heater 19 and the inner wall of the film formation chamber 100.

A plurality of gas supply ports 1a, 1b, 1c, and 1d supplying gas to a space inside of the liner 11 where the film formation process is performed are provided in an upper portion of the film formation chamber 100. Inert gas, hydrogen gas, and source gas of SiC, which is a film to be formed, (hereinafter, "SiC source gas") are supplied to each of the gas supply ports 1a and 2b via flow regulating valves 21, 22a, and 22b (hereinafter, also simply "valves 21, 22a, and 22b"), while flow rates of the inert gas, hydrogen gas, and SiC source gas are regulated, respectively. The inert gas is supplied to the gas supply ports is and id via a flow regulating valve 23 (hereinafter, also simply "valve 23") while the flow rate of the inert gas is regulated. A gas discharge port 12 discharging the gas is provided in a lower portion of the film formation chamber 100. It is desirable to provide the valves 22a and 22b near the gas supply ports 1a and 1b.

A gas supply port 2 supplying the inert gas to the space formed by the inner wall of the film formation chamber 100 and the liner 11 is provided on a sidewall of the film formation chamber 100 in the space. The inert gas is supplied to the gas supply port 2 via a flow regulating valve 24 (hereinafter, also simply "valve 24") while the flow rate of the inert gas is regulated.

A gas supply port 3 supplying the inert gas into the rotary cylinder 14 from a bottom of the rotary cylinder 14 is provided on the bottom. The gas supply port 3 is configured so that the inert gas is supplied to the gas supply port 3 via a flow regulating valve 25 (hereinafter, also simply "valve 25") while the flow rate of the inert gas is regulated.

A gas supply control unit 30 that controls the flow regulating valves 21, 22a, 22b, 23, 24, and 25 is provided so as to control the flow rates of various types of the gas supplied to the gas supply ports 1a, 1b, 1c, 1d, 2, and 3. A component that is a pair of a flow controller and a valve can be used as each of the flow regulating valves 21, 22a, 22b, 23, 24, and 25.

A thermometer 26 configured by, for example, a radiation thermometer and detecting temperatures of the substrate W and the susceptor 13 is provided above the film formation chamber 100. This thermometer 26 is connected to a temperature control unit 40 that controls temperatures of the lower heater 16 and the upper heater 19.

A gate 4 for transporting the substrate W into the film formation chamber 100 from outside or transporting the substrate W from the film formation chamber 100 to outside is provided on the sidewall of the film formation chamber 100. A transport unit 60 including a transport arm 5 for transporting the substrate W into the film formation chamber 100 via the gate 4 and mounting the substrate W on the susceptor 13 or for detaching the substrate W from the susceptor 13 and transporting the substrate W from the film formation chamber 100 is provided outside of the film formation chamber 100. A hand part 5a of the transport arm 5 can be formed using, for example, at least one of high heat-resistance C, SiC, and quartz.

Furthermore, a main control device 70 connected to the gas supply control unit 30, the temperature control unit 40, the rotary drive unit 50, and the transport unit 60 and collectively controlling these units 30, 40, 50, and 60 is provided.

A film formation method for epitaxially growing SiC on the substrate W using the film formation apparatus configured as described above is described with reference to a flowchart of FIG. 2.

The main control device 70 instructs the gas supply control unit 30 to control the valves 23, 24, and 25 to supply the inert gas to the gas supply ports 1c, 1d, 2, and 3. Types of the inert gas preferably include at least either Ar gas or He gas. In response to this instruction, the gas supply control unit 30 closes the valves 22a and 22b on paths of supplying the reactive gas to the gas supply ports 1a and 1b. In addition, the gas supply control unit 30 opens the valve 23 on a path of supplying the inert gas to the gas supply ports 1c and 1d, the valve 24 on a path of supplying the inert gas to the gas supply port 2, and the valve 25 on a path of supplying the inert gas to the gas supply port 3. The inert gas is thereby supplied to all of a space in the film formation chamber 100 where the film formation process is performed, a space in the rotary cylinder 14 where the lower heater 16 made of carbon is accommodated, and a space that is formed by the inner wall of the film formation chamber 100 and the liner 11 and where the upper heater 19 is accommodated, and these spaces are made in an inert gas atmosphere (STEP1).

The main control device 70 instructs the temperature control unit 40 to control the temperature of the susceptor 13 to be set equal to a predetermined transport temperature. In response to this instruction, the temperature control unit 40 controls the lower heater 16 and the upper heater 19 to heat the susceptor 13 so as to make the temperature of the susceptor 13 detected by the thermometer 26 equal to, for example, 1000° C. (STEP2).

When the temperature of the susceptor 13 reaches the predetermined transport temperature (STEP3), the main control device 70 instructs the transport unit 60 to transport the substrate W into the film formation chamber 100. In response to this instruction, the transport unit 60 transports the substrate W into the film formation chamber 100 via the gate 4 by means of the transport arm 5, and mounts the substrate W on the susceptor 13 using the thrusting mechanism 18 (STEP4).

After the substrate W is mounted on the susceptor 13, the main control device 70 instructs the gas supply control unit 30 to switch the gas supplied to the gas supply ports 1a and 1b from the inert gas to the hydrogen gas. In response to this instruction, the gas supply control unit 30 controls the valves 22a and 23 to switch the gas supplied into the film formation chamber 100 from the inert gas to the hydrogen gas. At this time, the gas supply control unit 30 controls the valve 23 to gradually decrease a rate of the inert gas supplied to the gas supply ports 1c and 1d and controls the valve 22a to gradually increase a rate of the hydrogen gas supplied to the gas supply ports 1a and 1b so that a pressure fluctuation in the film formation chamber 100 is within 400 Pa. Finally, only the hydrogen gas is supplied into the film formation chamber 100. At this time, the supply of the inert gas to the gas supply ports 2 and 3 continues. In parallel to such gas switching, the main control device 70 instructs the temperature control unit 40 to set the temperatures of the susceptor 13 and the substrate W to be equal to a predetermined film formation temperature. In response to this instruction, the temperature control unit 40 controls the lower heater 16 and the upper heater 19 to heat the susceptor 13 and the substrate W so that the temperatures of the susceptor 13 and the substrate W detected by the thermometer 26 are equal to the predetermined film formation temperature, for example, 1600° C. (STEP5).

When this gas switching and temperature increase are completed (STEP6), the film formation process on the substrate W is performed in predetermined conditions under the control of the gas supply control unit 30, the temperature control unit 40, and the rotary drive unit 50 in response to instructions from the main control device 70 (STEP7).

During this film formation process, the rotary drive unit 50 rotates the susceptor 13 and the substrate W at a predetermined rotational velocity in a state where the temperature control unit 40 controls the temperatures of the susceptor 13 and the substrate W to be kept at the predetermined film formation temperature, for example, 1600° C. The gas supply control unit 30 controls the valves 22a and 22b to supply the SiC source gas as well as the hydrogen gas from the gas supply ports 1a and 1b into the film formation chamber 100 as the reactive gas. The supplied reactive gas arrives onto the substrate W, thereby forming an SiC epitaxial film on the substrate W. The surplus reactive gas is discharged from the gas discharge port 12. Even during this film formation process, the supply of the inert gas to the gas supply ports 1c, 1d, 2, and 3 continues, so that the space in the rotary cylinder 14 where the lower heater 16 made of carbon is accommodated and the space that is formed by the inner wall of the film formation chamber 100 and the liner 11 and where the upper heater 19 is accommodated are in the inert gas atmosphere.

When the film formation process ends (STEP8), the main control device 70 instructs the gas supply control unit 30 to switch the gas supplied into the film formation chamber 100 from the reactive gas to the inert gas. In response to this instruction, the gas supply control unit 30 controls first the valve 22b to stop supplying the SiC source gas while continuing the supply of the hydrogen gas. The gas supply control unit 30 then controls the valves 22a and 23 to switch the gas supplied into the film formation chamber 100 from the hydrogen gas to the inert gas. At this time, the gas supply control unit 30 controls the valve 23 to gradually increase the rate of the inert gas supplied to the gas supply ports 1c and 1d and controls the valve 22a to gradually decrease the rate of the hydrogen gas supplied to the gas supply ports 1a and 1b so that the pressure fluctuation in the film formation chamber 100 is within 400 Pa. Finally, only the inert gas is supplied to the gas supply ports 1a and 1b. Furthermore, the gas supply control unit 30 controls the valve 21 to supply the inert gas to the gas supply ports 1a and 1b, and discharges the hydrogen gas remaining on the paths into the film formation chamber 100. At this time, the supply of the inert gas to the gas supply ports 1c, 1d, 2, and 3 continues. In parallel to this gas switching, the main control device 70 instructs the temperature control unit 40 to set the temperatures of the susceptor 13 and the substrate W to be equal to the predetermined transport temperature, for example, 1000° C. In response to this instruction, the temperature control unit 40 controls the lower heater 16 and the upper heater 19 to decrease the temperatures of the susceptor 13 and the substrate W detected by the thermometer 26 down to the predetermined transport temperature (STEP9).

When this gas switching and temperature decrease are completed (STEP10), the main control device 70 instructs the transport unit 60 to transport the substrate W from the film formation chamber 100. In response to this instruction, the transport unit 60 detaches the substrate W from the susceptor 13 using the thrusting mechanism 18 and transports the substrate W from the film formation chamber 100 via the gate 4 by means of the transport arm 5. During a period from the detachment of the substrate W from the susceptor 13 until a predetermined time passes, the gas supply control unit 30 controls the valve 25 to gradually increase a supply amount of the inert gas supplied to the gas supply port 3 in response to an instruction of the main control device 70. By gradually increasing the supply amount of the inert gas supplied to the gas supply port 3 as described above, it is possible to prevent the reactive gas remaining in the space in the film formation chamber 100 where the film formation process is performed from entering the space in the rotary cylinder 14 where the lower heater 16 made of carbon is accommodated as a result of the detachment of the substrate W from the susceptor 13 (STEP11).

After the substrate W is transported from the film formation chamber 100, the main control device 70 instructs the gas supply control unit 30 to continue supplying the inert gas to the gas supply ports 1c, 1d, 2, and 3. In response to this instruction, the gas supply control unit 30 continues the state of closing the valves 22a and 22b on the paths of supplying the reactive gas to the gas supply ports 1a and 1b and the state of opening the valve 23 on the paths of supplying the inert gas to the gas supply ports 1c and 1d, the valve 24 on the path of supplying the inert gas to the gas supply port 2, and the valve 25 on the path of supplying the inert gas to the gas supply port 3, With this configuration, all of the space in the film formation chamber 100 where the film formation process is performed, the space in the rotary cylinder 14 where the lower heater 16 made of carbon is accommodated, and the space that is formed by the inner wall of the film formation chamber 100 and the liner 11 and where the upper heater 19 is accommodated are kept in the state of the inert gas atmosphere (STEP12).

It suffices to return to STEP4 and to continue the process so as to subsequently perform the film formation process on the next substrate W.

As described above, according to the present embodiment, the reactive gas does not enter the space in the rotary cylinder 14 where the lower heater 16 made of carbon is accommodated and this space is kept in the inert gas atmosphere in not only a case where the substrate W is mounted on the susceptor 13 but also a case of a state where the space in the film formation chamber 100 where the film formation process is performed is continuous to the space in the rotary cylinder 14 where the lower heater 16 made of carbon is accommodated before the substrate W is mounted on the susceptor 13 or after the substrate W is detached from the susceptor 13. Therefore, it is possible to prevent the lower heater 16 made of carbon from being corroded by the hydrogen gas contained in the reactive gas because of no exposure of the lower heater 16 to the reactive gas.

The corrosion of the lower heater 16 made of carbon is suppressed as described above, even if the film formation temperature is as high as 1500° C. to 1700° C., it is possible to transport the substrate W into or from the film formation chamber 100, for example, at a temperature equal to or higher than the temperature of the susceptor 13 of 900° C. and equal to or lower than the film formation temperature with the temperatures of the heaters 16 and 19 set at 1000° C. Therefore, productivity can be improved.

Furthermore, at the time of switching the gas supplied into the film formation chamber 100 from the inert gas to the reactive gas (hydrogen gas) or at the time of switching from the reactive gas (hydrogen gas) to the inert gas, the pressure fluctuation in the film formation chamber 100 is suppressed to fall within 400 Pa. By suppressing the pressure fluctuation to fall within 400 Pa, it is possible to suppress the generation of particles resulting from flinging up reactive products adhering into the film formation chamber 100.

Furthermore, while a case of epitaxially growing SiC has been described above, the present embodiment is suitably applicable particularly to a case of forming a film at a high temperature such as the case of epitaxially growing SiC. However, the present embodiment is not limited thereto, but is also applicable to any film formation apparatuses or any film formation methods for forming a film on a surface of a substrate by supplying reactive gas into a film formation chamber and heating the substrate mounted within the film formation chamber.

Furthermore, in the embodiment described above, while an example of forming a film with a substrate being rotated has been described, the embodiment is not limited thereto. The present invention is also applicable to a case of forming a film without rotating a substrate. In addition, the shapes of respective members and all film formation apparatuses, which comprise elements of the present invention and can be appropriately designed and replaced by persons skilled in the art, are incorporated in the scope of the present invention.

The invention claimed is:

1. A film formation apparatus comprising:
   a film formation chamber configured to perform a film formation process on a transported substrate;
   a hollow cylindrical liner configured to separate an inner wall of the film formation chamber from a space where the film formation process is performed;
   a susceptor configured to mount the substrate thereon;
   a rotary cylinder configured to support the susceptor on an upper portion of the rotary cylinder;
   a rotary shaft arranged below the film formation chamber, and configured to rotate the rotary cylinder;
   a first heater arranged in the rotary cylinder, and configured to heat the susceptor and the substrate from below;
   a second heater arranged between the liner and the inner wall, and configured to heat the susceptor and the substrate from above;
   a temperature control unit configured to control temperatures of the first and second heaters in order to set a temperature of the susceptor to be equal to a predetermined transport temperature or a predetermined film formation temperature;
   a temperature detection unit configured to detect the temperature of the susceptor;
   a first gas supply unit provided in an upper portion of the film formation chamber, and configured to supply reactive gas and inert gas to inside of the liner, the reactive gas containing hydrogen gas and source gas;
   a second gas supply unit configured to supply the inert gas between the liner and the inner wall;
   a third gas supply unit configured to supply the inert gas into the rotary cylinder;
   a transport unit configured to transport the substrate into or from the film formation chamber at the predetermined transport temperature;
   a first valve supplying inert gas to the first gas supply unit;
   a second valve supplying reactive gas to the first gas supply unit;
   a third valve supplying inert gas to the second gas supply unit;
   a fourth valve supplying inert gas to the third gas supply unit; and
   a gas supply control unit controlling the first and second valves to switch the gas supplied to the first gas supply unit between the inert gas and the reactive gas,
   wherein the gas supply control unit is configured to control the first, third, and fourth valves to supply the inert gas from the first to third gas supply units at least when the transport unit transports the substrate into or from the film formation chamber,
   the gas supply control unit is configured to control the second valve to supply the reactive gas from the first gas supply unit and control the third and fourth valves to supply the inert gas from the second and third gas supply units when the substrate is mounted on the susceptor and the temperature of the susceptor is equal to the predetermined film formation temperature, and
   the temperature control unit is configured to control the temperature of the susceptor detected by the temperature detection unit to be equal to or higher than 900° C. and to be equal to or lower than the predetermined film formation temperature when the transport unit transports the substrate into or from the film formation chamber.

2. The apparatus of claim 1, wherein the transport unit transports the substrate into or from the film formation chamber when the temperature of the susceptor detected by the temperature detection unit Is equal to or higher than 900° C. and equal to or lower than 1700° C.

3. The apparatus of claim 1, wherein the gas supply control unit controls the first and second valves to supply amounts of the inert gas and the hydrogen gas supplied from the first gas supply unit in such a manner that a pressure fluctuation in the film formation chamber falls within 400 Pa, and switches gas supplied from the first gas supply unit between the inert gas and the hydrogen gas.

4. The apparatus of claim 1, wherein the temperature control unit controls a temperature of the substrate to be increased up to 1500° C. to 1700° C. according to switching of gas supplied from the first gas supply unit from the inert gas to the hydrogen gas by the gas supply control unit.

5. The apparatus of claim 1, wherein the inert gas comprises at least either Ar gas or He gas.

6. The apparatus of claim 1, wherein the susceptor comprises an SIC layer or a TaC layer on a surface thereof.

7. The apparatus of claim 1, wherein the transport unit comprises a transport arm, and a hand part of the transport arm comprises at least one of C, SIC, and quartz.

* * * * *

UNITED STATES PATENT AND TRADEMARK OFFICE
CERTIFICATE OF CORRECTION

PATENT NO. : 9,570,337 B2  
APPLICATION NO. : 14/219159  
DATED : February 14, 2017  
INVENTOR(S) : Ito et al.

Page 1 of 1

It is certified that error appears in the above-identified patent and that said Letters Patent is hereby corrected as shown below:

In the Claims

Claim 2, Column 9, Line 4, change "Is" to --is--.

Signed and Sealed this
Eighteenth Day of July, 2017

Joseph Matal
*Performing the Functions and Duties of the*
*Under Secretary of Commerce for Intellectual Property and*
*Director of the United States Patent and Trademark Office*